United States Patent [19]

Lewis et al.

[11] Patent Number: 4,526,856
[45] Date of Patent: Jul. 2, 1985

[54] LOW STRIATION POSITIVE DIAZOKETONE RESIST COMPOSITION WITH CYCLIC KETONE(S) AND ALIPHATIC ALCOHOL AS SOLVENTS

[75] Inventors: James M. Lewis, Williamsville; Robert A. Owens, East Amherst; Richard F. Sweeney, Elma; Ronald W. Wake, West Seneca, all of N.Y.; Robert E. Rinehart, Newtown, Conn.

[73] Assignee: Allied Corporation, Morris Township, Morris County, N.J.

[21] Appl. No.: 497,390

[22] Filed: May 23, 1983

[51] Int. Cl.$^3$ .................. G03C 1/60; G03C 1/54; G03F 7/26
[52] U.S. Cl. .................. 430/191; 430/165; 430/169; 430/192; 430/193; 430/326
[58] Field of Search ............. 430/192, 193, 191, 165, 430/169, 168, 326

[56] References Cited

U.S. PATENT DOCUMENTS

| | | | |
|---|---|---|---|
| 3,471,289 | 10/1969 | Herrick | 430/278 |
| 3,634,086 | 1/1972 | Lawson et al. | 430/294 |
| 4,123,279 | 10/1978 | Kobayashi | 430/192 |
| 4,266,001 | 5/1981 | Buhr et al. | 430/192 |
| 4,377,631 | 3/1983 | Toukhy et al. | 430/192 |

FOREIGN PATENT DOCUMENTS

| | | | |
|---|---|---|---|
| 1073098 | 6/1967 | United Kingdom | 430/193 |
| 2023858 | 1/1980 | United Kingdom | 430/192 |

OTHER PUBLICATIONS

Mondou et al., *IBM Technical Disclosure Bulletin*, vol. 18, No. 2, pp. 391-392, 7/1975.
Grant J., *Hackh's Chemical Dictionary*, 4th Ed. 1969, pp. 194-195.
Noller Carl R., *Textbook of Organic Chemistry*, 2nd Ed., 1958, p. 58.
DeForest W. S., "Photoresist Matl's and Processes", McGraw Hill, 1975, pp. 48 and 133.
Elliott D. J., "Integrated Circuit Fabrication Tech.", McGraw Hill, 1982, p. 71.
Thompson L. F., "Introduction to Microlithography", ACS Symposium Series 219, 1983, p. 114.

*Primary Examiner*—Charles L. Bowers, Jr.
*Attorney, Agent, or Firm*—Arthur J. Plantamura; Jay P. Friedenson

[57] ABSTRACT

A novel photoresist formulation is provided which provides low striations and excellent wetting properties. The photoresist composition may be applied by spin casting on various substrates used in integrated circuit manufacture. The essential component in this invention is the solvent composition which consists of cyclopentanone (or cyclopentanone-cyclohexanone blend) in combination with an aliphatic alcohol of 5-12 carbon atoms. These solvent components when used in certain specific ratios provide unexpectedly good wetting of various substrates and low striation films.

18 Claims, No Drawings

LOW STRIATION POSITIVE DIAZOKETONE RESIST COMPOSITION WITH CYCLIC KETONE(S) AND ALIPHATIC ALCOHOL AS SOLVENTS

BACKGROUND OF THE INVENTION

1. Field of the Invention

This invention relates to a novel positive photoresist composition and to the method for providing positive photoresist layers. In particular the invention deals with alkali soluble resin-diazo ketone photoresists that have good wetting properties on various substrates. The invention is particularly useful in that the photoresist compositions provided obviate the adverse effects that are characterized as striations which occur and result in a nonuniform film and consequently in a relatively inferior semiconductor device.

2. Description of the Prior Art

Photoresists are materials which change their solubility in response to a developer solution after the photoresist has been exposed, such as to ultraviolet radiation. Photoresist compositions comprise a photosensitive compound (hereafter sometimes called sensitizer or photosensitizer), a film forming polymeric resin and a solvent. As a consequence of the exposure to radiation of the photoresist, a different solubility rate results between the exposed and unexposed (masked over) portions of a resist film that yields a surface relief pattern after the development. Those photoresists which become more soluble in the exposed regions are referred to as positive photoresists.

Positive photoresists are typically comprised of an aqueous alkaline soluble resin, such as novolac resin or poly p-hydroxy styrene, and a diazonaphthoquinone sulfonic acid ester sensitizer. The resin and sensitizer are applied such as by spin coating from an organic solvent or solvent mixture onto a substrate, such as silicon wafers and chrome plated glass plates. The developer used to process the positive photoresists are aqueous alkaline solutions, such as sodium silicate, potassium hydroxide, tetramethyl ammonium hydroxide and ammonium hydroxide. The developer removes the areas of the coated photoresist film that has been exposed to light or other form of irradiaton so as to produce a pattern in the photoresist film.

The application of a photosensitive film to various substrates is an essential step in the fabrication of integrated circuits. The substrates are generally silicon wafers which may have a thin oxide coating or other coating such as a silicon nitride or aluminum. The photosensitive film is used to pattern the substrate in a series of steps including exposure, development and substrate etch. It is essential that the mask pattern be accurately reproduced in the substrate etch pattern. To achieve this high degree of accuracy, it is essential that the photoresist film be of uniform thickness. Unfortunately, many photoresist formulations do not provide uniform coating, either because they do not wet and uniformly spread out over the substrate or because of striations in the film that are caused by the mechanics of spin casting. Striations are radial variations in film thickness that can be as much as 200 to 600 Å.

A key component which determines the wetting, spreading and striations performance of a photoresist is the solvent.

Photoresists are applied to silicon wafers having a variety of surfaces comprising silicon, polycrystalline silicon, silicon dioxide, silicon nitride, aluminum, etc. Many of these surfaces are treated with adhesion promoters which help to prevent undercut of the photoresist film during wet etching of the exposed, developed wafer. This can cause the wafer pattern to deviate from the photomask geometries. A typical adhesion promoter widely used in the industry is hexamethyldisilazane. Although this adhesion promoter limits undercut during wet etch, it makes the surface more difficult to wet. The extent of this dewetting effect is dependent upon the mode and time of contact of the silicon wafer with the hexamethyldisilazane. Wafers which have been treated with hexamethyldisilazane vapor for periods of greater than ten minutes can be particularly difficult to wet.

The extent of striations is highly dependent upon the nature of the solvent. The factors which affect striations are not fully understood. There is evidence that the vapor pressure of the solvent, the degree of interaction of solvent with the resin, and the acceleration of the wafer during application have some effect on the formation of striations.

It has been observed that some solvents are more effective than others in providing improved wetting of the substrate. For example, n-butyl acetate has excellent wetting properties but gives very bad striations. Diglyme gives no striations but has extremely poor wetting characteristics. Xylene has been used to limit striations but it has adverse effects on wetting.

In addition, all these materials are poor solvents for such typical sensitizers as 2,3,4-tris(6-diazo-5,6-dihydro-5-oxo-1-naphthalenesulfonyloxy)benzophenone or 2-hydroxy-3,4-bis(6-diazo-5,6-dihydro-5-oxo-1-naphthalenesulfonyloxy)benzophenone or 2,4-bis(6-diazo-5,6-dihydro-5-oxo-1-naphthalenesulfonyloxy)benzophenone, which are the preferred sensitizers for a high sensitivity positive photoresist.

The solvent most commonly used in the formulation of commercial positive photoresists is cellosolve acetate. Evidence has been disclosed that this solvent has significant toxic effects. In addition, resist formulations made using this solvent show striations. Some commercial photoresists contain a mixture of cellosolve acetate, xylene and n-butyl acetate. The xylene and n-butyl acetate may be used to alter the wetting and striations performance of the product. Although the n-butyl acetate improves wetting, the xylene does not totally eliminate striations. Surface active agents added to certain formulations improve wetting and decrease striations. A serious limitation of surface active agents is that they are not volatile and do not evaporate with the solvent during the spin casting step or in the subsequent oven bake between 90°–110° C. generally used to remove the solvent. The presence of residual surface active agents even at very low levels of less than 0.1% adversely affects the performance of the resist. This residual surfactant seriously affects resolution and may lead to the loss of the pattern where dimensions are less than two microns.

In addition to providing no striations and good wetting and spreading properties, the solvent must be a good solvent for both the resin and sensitizer. The preferred photosensitive compounds having more than one diazonaphthoquinone moiety are generally of low solubility. Suitable solvents which possess all of the desired properties, including solubility, wetting, and low striations, are difficult to find. In order to obtain the requisite sensitivity and contrast, it is necessary to have a sufficiently high concentration of photosensitive compound in the resist formulation to prevent dissolution of the unexposed resist during development. To overcome this difficulty, it is a common practice to use a mixture of sensitizers consisting of less soluble and more soluble types or even to operate with the solution supersaturated relative to the less soluble but more effective sensitizer component. This can lead to short shelf life and precipitation of the sensitizer prior to or during use of the product.

It is accordingly apparent that a need exists for a photoresist formulation which provides low striations and excellent wetting properties when spun cast on various substrates used in integrated circuit manufacture. The key element in this invention is the solvent composition which consists of cyclopentanone, or cyclopentanone and cyclohexanone with an aliphatic alcohol. These solvent components when used in certain critical ratios provide unexpectedly good wetting of various substrates and low striation films when spun applied.

SUMMARY OF THE INVENTION

In accordance with the invention, a positive photoresist formulation with low striations is provided. The formulation is characterized additionally by excellent wetting properties and relatively superior environmental safety. Essential to the invention is a solvent composition which has good solubility for the photosensitive compound containing one, two or three diazonaphthoquinone moieties. This solvent composition gives no observable striations and gives excellent wetting properties without the addition of non-volatile surface active agents. The solvent composition comprises a mixture of cyclopentanone (or cyclopentanone and cyclohexanone) with an aliphatic alcohol.

The low striations and good wetting properties are produced by the addition of an aliphatic alcohol to (a) cyclopentanone or (b) cyclopentanone and cyclohexanone. In general, aliphatic alcohols containing between 6 and 12 carbon atoms are effective in limiting striations and improving wetting. The preferred compositions are aliphatic alcohols having between 6 and 8 carbons. The most preferred compositions are n-hexanol, n-heptanol, n-octanol, 2-octanol or mixtures thereof.

When a particularly effective but low solubility sensitizer such as 2,3,4-tris(6-diazo-5,6-dihydro-5-oxo-1-naphthalenesulfonyloxy)benzophenone is used in formulating the resist, the cyclopentanone or cyclohexanone should constitute at least 20% of the total solvent mixture. More preferably the solvent mixture should consist of about 50% of the cyclic ketone. When a relatively high concentration of a low solubility photosensitive compound, e.g. one having a solubility of about 2–7%, is used, the most preferred solvent composition should contain at least 50% cyclopentanone or mixed cyclic ketone. To be effective the alcohol component should comprise between 2 and 50% of the solvent mixture. Increasing the amount of alcohol decreases the solubility of the diazonaphthoquinone sulfonate ester. The preferred solvent contains between 10 and 30% alcohol and between 90 and 70% cyclic ketone.

The wetting characteristics of positive photoresists in various solvents was estimated by spin coating specially prepared wafers with the test photoresist and observing the extent of dewetting.

DESCRIPTION OF THE PREFERRED EMBODIMENT

In producing the novel photoresist composition of the invention, which is characterized by improved properties that include excellent wetting and low striations, the key ingredient of the photoresist composition is the solvent composition. The solvent comprises a cyclic ketone selected from the group consisting of cyclopentanone and cyclopentanone-cyclohexanone blends in combination with an aliphatic alcohol of 6–12 carbon atoms.

The photosensitive compounds that may be incorporated into the sensitizer-resin-solvent compositions of the present invention are compounds which upon exposure to light become more soluble in aqueous alkaline developers.

Suitable sensitizers used in positive photoresists of this kind are diazo ketones having diazo and keto groups at adjacent positions on the molecule, such as the 1,2-naphthoquinone-diazo-5-sulfonic acid esters which are described in U.S. Pat. Nos. 3,046,118; 3,046,121; 3,106,465; 3,148,983; 3,201,239 and 3,666,473 which are hereby incorporated by reference. Illustrative of such photosensitive compounds are the following:

2,3-dihydroxy-4-(6-diazo-5,6-dihydro-5-oxo-1-naphthalenesulfonyloxy)benzophenone (5); 2-hydroxy-3,4-bis(6-diazo-5,6-dihydro-5-oxo-1-naphthalenesulfonyloxy)benzophenone (1); 2,3,4-tris(6-diazo-5,6-dihydro-5-oxo-1-naphthalenesulfonyloxy)benzophenone (11); 4,4′-bis(6-diazo-5,6-dihydro-5-oxo-1-naphthalenesulfonyloxy)benzophenone (12); 2-hydroxy-4-(6-diazo-5,6-dihydro-5-oxo-1-naphthalenesulfonyloxy)benzophenone (2); 2,4-bis(6-diazo-5,6-dihydro-5-oxo-1-naphthalenesulfonyloxy)benzophenone (15); or 2,3-dibromo-1-(6-diazo-5,6-dihydro-5-oxo-1-naphthalenesulfonyloxy)-propane (17).

TABLE A

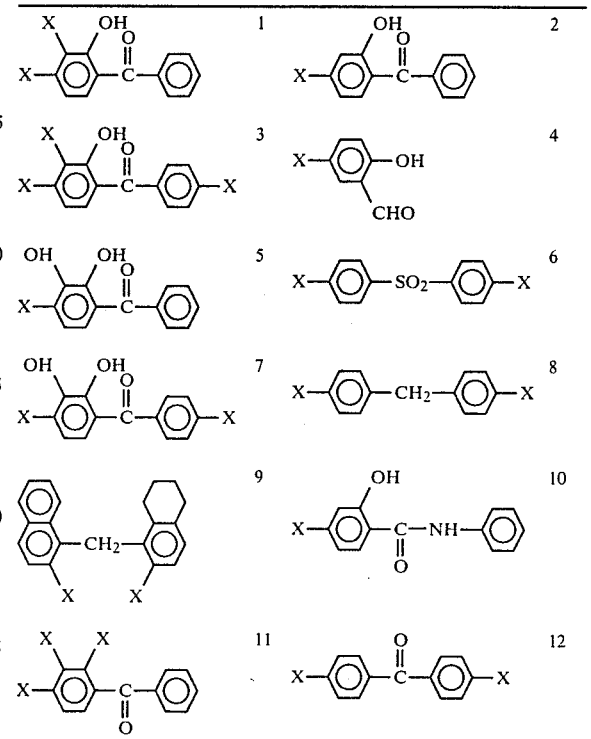

TABLE A-continued

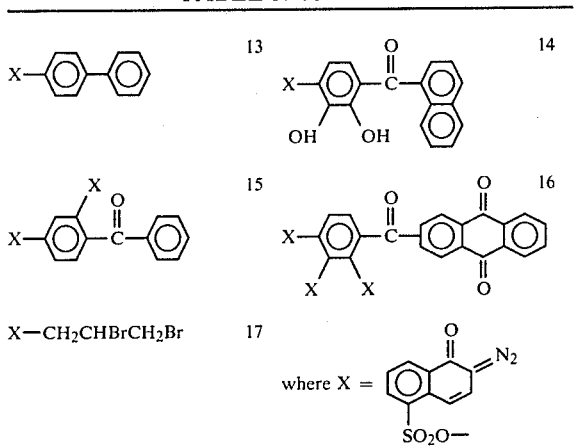

The sensitizer acts to decrease the solubility of the resin. Upon exposure to light the sensitizer undergoes a chemical reaction to form a carboxylic acid which increases the rate of solubilization of the photoresist in the exposed areas.

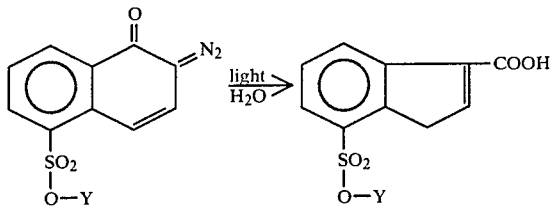

In general, sensitizers which contain more than one diazonaphthoquinone group are preferred because they appear to provide higher contrast photoresists. Illustrative of preferred photosensitive compounds are the following: 2,3,4-tris(6-diazo-5,6-dihydro-5-oxo-1-naphthalenesulfonyloxy)benzophenone; 2-hydroxy-3,4-bis(6-diazo-5,6-dihydro-5-oxo-1-naphthalenesulfonyloxy)benzophenone and 2,4-bis(6-diazo-5,6-dihydro-5-oxo-1-naphthalenesulfonyloxy)benzophenone.

Suitable alkali soluble nonhardenable resins that may be employed in the positive photoresists contemplated by this invention are such as the prepolymerized phenolic-aldehyde resins, e.g., phenol formaldehyde, which are known as novolacs and are available commercially. Resins of this kind are disclosed, for example, in U.S. Pat. No. 3,201,239 and U.S. Pat. No. 3,868,254 both of which are incorporated herein by reference. These phenolic-aldehyde resinous compounds must be soluble in organic solvents and alkaline solutions.

A number of phenolic compounds and aldehyde or aldehyde producing compounds will yield novolac resins through well-known syntheses. Phenolic compounds that may be used include phenol, cresol, resorcinol, naphthol, hydroquinone, alkyl phenols and halogenated phenols. Illustrative of the aldehydes and aldehyde producing compounds that may be used are formaldehyde, acetaldehyde, paraformaldehyde, acrolein, crotonaldehyde and furfural.

The cyclic ketone containing solvent used in preparing the novel photoresist composition of the invention is characterized by having good solubility for sensitizers containing one, two or three diazonaphthoquinone moieties. Moreover this solvent composition gives minimal striations and excellent wetting properties without the addition of non-volatile surface active agents. The solvent composition comprises a mixture of cyclopentanone (or a blend of cyclopentanone and cyclohexanone) with an aliphatic alcohol.

The low striations and good wetting properties are produced by the addition of an aliphatic alcohol to the cyclic ketone, cyclohexanone or a mixture of cyclopentanone and cyclohexanone. In general, aliphatic alcohols containing between 6 and 12 carbon atoms are effective in limiting striations and improving wetting. The preferred compositions are aliphatic alcohols having between 6 and 8 carbons. The most preferred compositions are n-hexanol, n-heptanol, n-octanol, 2-octanol or mixtures thereof.

When a particularly effective but low solubility sensitizer such as 2,3,4-tris(6-diazo-5,6-dihydro-5-oxo-1-naphthalensulfonyloxy)benzophenone is used in formulating the resist, the cyclopentanone or cyclohexanone should constitute at least 20% of the total solvent mixture. Most preferably the solvent mixture should consist of about 50% cyclic ketone. When a relatively high concentration of a low solubility sensitizer (2-7%) is used, the most preferred solvent composition should contain at least 50% cyclopentanone or mixed cyclokotone and the alcohol component should comprise between 2 and 50% of the solvent mixture. Increasing the amount of alcohol decreases the solubility of the diazonaphthoquinone sulfonate ester. The preferred solvent contains between 10 and 30% alcohol and between 90 and 70% cyclic ketone.

The wetting characteristics of positive photoresists in various solvents was estimated by spin coating especially prepared wafers with the test photoresist and observing the extent of dewetting.

The following procedure was employed in applying the novel photoresist composition in preparing semiconductor devices.

The silicon wafers (76.2 mm diameter) were freshly oxidized at 1100° C. in a steam, oxygen atmosphere for 1 hour. The wafers were cooled and exposed to hexamethyldisilazane (HMDS) vapor in a closed glass vessel for 1 or 2 hours. The longer the exposure, the less wettable the wafer becomes. The photoresist is spun applied at about 5-6K rpm using a Headway Spinner model EC-101 for about 30 seconds to provide a resist film which is about 1 micrometer thick. The coated wafer is heated in a circulating air oven for 30 minutes at 100° C. Dewetting was observed as a function of the number of hours the wafer had been exposed to HMDS vapor.

Striations are measured using a Sloan Dektak II equipped with a 12.5 micron diameter stylus. The stylus is placed in contact with the wafer from between 6 mm and 10 mm from the edge of the wafer and moved across the wafer perpendicular to the radius for a distance of 1 to 5 mm. An interval which is essentially flat is identified and the film thickness variations are measured using an expanded scale.

In the following examples, results of which are summarized in Table I, the wetting property and/or the depth of striations was determined for positive photoresist prepared in a number of different solvent systems.

EXAMPLE I 30 parts of novolac resin, 70 parts of cyclopentanone and 7.5 parts of sensitizer were stirred at room temperature until complete dissolution was achieved (master batch). The photosensitizer consisted of a mixture of esters derived from the reaction of 2,3,4-dihydroxybenzophenone with 1,2-naphthoquinone-2-diazo-5-sulfonyl chloride. 8.3 parts of n-octanol and 7.2 parts of cyclopentanone were added to 40 parts of this solution to give a photoresist formulation containing cyclopentanone and n-octanol in an 80:20 ratio and containing 25.2% solids. The wetting and striations data are shown in Table I.

EXAMPLE II (Comparative)

30 parts of novolac resin, 70 parts cyclopentanone, and 3.33 parts of sensitizer (15) were stirred at room temperature until dissolved (master batch). 80 parts of this mixture were diluted with 20 parts of cyclopentanone to give a photoresist formulation in a cyclopentanone solvent having a 25.8% solids content. Wetting and striations data are shown in Table I.

EXAMPLE III (Comparative)

15.5 parts of cyclopentanone were added to the master batch prepared in Example I. This provided a photoresist formulation in cyclopentanone solvent containing 25.2% solids. The wetting and striations data are shown in Table I.

EXAMPLE IV 7.2 parts cyclohexanone and 8.3 parts n-hexanol were mixed with 40 parts of the master batch prepared in Example I. The resulting photoresist formulation contained cyclopentanone, cyclohexanone and n-hexanol in the ratio of 63:17:20 and contained 25.5% solids. The wetting and striations data are shown in Table I.

EXAMPLE V 8.3 parts of n-hexanol and 7.2 parts of cyclopentanone were added to 40 parts of the master batch prepared in Example I to give a photoresist formulation containing cyclopentanone and n-hexanol in an 80:20 ratio and containing 25.2% solids. The wetting and striations data are shown in Table I.

EXAMPLE VI 14.8 parts of n-hexanol and 5.2 parts of cyclopentanone were mixed with 80 parts of the master batch prepared in Example II to give a photoresist formulation containing cyclopentanone and n-hexanol in an 80:20 ratio and having a solids content of 25.8%. The wetting and striations data are shown in Table I.

EXAMPLE VII 14.8 parts of n-decanol and 5.2 parts of cyclopentanone were mixed with 80 parts of the master batch prepared in Example II to give a photoresist formulation containing cyclopentanone and n-decanol in an 80:20 ratio and having a solids content of 25.8%. The wetting and striations data are shown in Table I.

EXAMPLE VIII (Comparative)

14.8 parts of n-pentanol and 5.2 parts of cyclopentanone were mixed with 80 parts of the master batch prepared in Example II to give a photoresist formulation containing cyclopentanone and n-pentanol in an 80:20 ratio and having a solids content of 26.0%. The wetting data is shown in Table I.

EXAMPLE IX 14.8 parts of n-octanol and 5.2 parts of cyclopentanone were mixed with 80 parts of the master batch prepared in Example II to give a photoresist formulation containing cyclopentanone and n-octanol in an 80:20 ratio and containing 26.0% solids. The wetting and striations data are shown in Table I.

EXAMPLE X (Comparative)

30 parts of novolac resin, 70 parts of cyclohexanone and 3.33 parts sensitizer (15) were stirred at room temperature until dissolved (master batch). 20 parts cyclohexanone were added to 80 parts of this master batch to give a photoresist formulation in a cyclohexanone solvent having a 26.0% solids content. Wetting and striations data are shown in Table I.

EXAMPLE XI 12.6 parts of cyclohexanone and 7.4 parts n-hexanol were mixed with a previously prepared mixture of 25 parts of the master batch prepared in Example X and 55 parts of the master batch prepared in Example II. This provided a photoresist formulation containing cyclopentanone, cyclohexanone and n-hexanol in a 50:40:10 ratio and having a solids content of 26.0%. The wetting and striations data are shown in Table I.

EXAMPLE XII (Comparative)

5.2 parts of cyclohexanone and 14.8 parts of n-butyl acetate were mixed with 80 parts of the master batch prepared in Example X to give a photoresist formulation containing cyclohexanone and n-butyl acetate in an 80:20 ratio and containing 26.0% solids. The wetting and striation data are shown in Table I.

EXAMPLE XIII (Comparative)

14.8 parts of diacetone alcohol and 5.2 parts of cyclopentanone were mixed with 80 parts of the master batch prepared in Example II to give a photoresist formulation containing cyclopentanone and diacetone alcohol in a 80:20 ratio and containing 26.0% solids. The wetting data is shown in Table I.

EXAMPLE XIV 512 parts novolac resin, 1075 parts of cyclopentanone, 359 parts cyclohexanone, 359 parts n-hexanol and 64 parts sensitizer (15) were stirred at room temperature until dissolution was complete. This gave a photoresist formulation containing cyclopentanone, cyclohexanone and n-hexanol in a 60:20:20 ratio and a solids content of 24.3% solids. The wetting data is shown in Table I.

EXAMPLE XV 512 parts resin, 1434 parts cyclopentanone, 359 parts n-hexanol and 64 parts sensitizer (15) were stirred at room temperature until solution was complete. 50 parts of this solution were mixed with 50 parts of the formulation prepared in Example XIV to give a photoresist formulation containing cyclopentanone, cyclohexanone and n-hexanol in a 70:10:20 ratio and having a 24.3% solids content. The wetting and striations data are shown in Table I.

EXAMPLE XVI 8.5 parts of n-decanol and 7 parts of cyclopentanone were added to a mixture of 27 parts of the master batch prepared in Example II and 13 parts of the master batch prepared in Example X. This gave a photoresist containing cyclopentanone, cyclohexanone and n-decanol in a 60:20:20 ratio and containing 24.3% solids. The wetting and situations data are shown in Table I.

EXAMPLE XVII 8.5 parts of 2-octanol and 7 parts cyclopentanone were added to 40 parts of the master batch prepared in Example II. This gave a photoresist containing cyclopentanone and 2-octanol in an 80:20 ratio, and containing 24.3% solids. Wetting and striation data are shown in Table I.

EXAMPLE XVIII 8.5 parts of 1-heptanol and 7 parts cyclopentanone were added to 40 parts of the master batch prepared in Example II. This gave a photoresist containing cyclopentanone and heptanol in an 80:20 ratio, containing 24.3% solids. Wetting and striation data are shown in Table I.

EXAMPLE XIX

To 40 parts of the master batch prepared in Example II were added 8.5 parts of 2-methyl-1-pentanol and 7 parts cyclopentanone to give a photoresist containing cyclopentanone and 2-methyl-1-pentanol in an 80:20 ratio, and containing 24.3% solids. Wetting and striation data are shown in Table I.

TABLE I

Wetting and Striations Performance of Positive Resist Formulations

| Example | Solvent Composition Parts by Weight Cyclopentanone | Cyclohexanone | Other | Photosensitive Compound[d] | Wetting[a] | Striations[b] |
|---|---|---|---|---|---|---|
| I | 80 | 0 | n-octanol (20) | A | Yes | Pass |
| II | 100 | 0 | 0 | B | No | Fail |
| III | 100 | 0 | 0 | A | No | Fail |
| IV | 63 | 17 | n-hexanol (20) | A | Yes | Pass |
| V | 80 | 0 | n-hexanol (20) | A | Yes | Pass |
| VI | 80 | 0 | n-hexanol (20) | B | Yes | Pass |
| VII | 80 | 0 | n-decanol (20) | B | Yes | Pass |
| VIII | 80 | 0 | n-pentanol (20) | B | No | c |
| IX | 80 | 0 | n-octanol (20) | B | Yes | Pass |
| X | 0 | 100 | 0 | B | Yes | Fail |
| XI | 50 | 40 | n-hexanol (10) | B | Yes | Pass |
| XII | 0 | 80 | n-butyl acetate (20) | B | No | Fail |
| XIII | 80 | 0 | diacetone alcohol (20) | B | No | c |
| XIV | 60 | 20 | n-hexanol (20) | B | Yes | c |
| XV | 70 | 10 | n-hexanol (20) | B | Yes | Pass |
| XVI | 60 | 20 | n-decanol (20) | B | Yes | Pass |
| XVII | 80 | 0 | 2-octanol (20) | B | Yes | Pass |
| XVIII | 80 | 0 | 1-heptanol (20) | B | Yes | Pass |
| XIX | 80 | 0 | 2-methyl-1-pentanol (20) | B | Yes | Pass |

Notes to Table I
[a] Yes indicates that a wafer treated with hexamethyldisilazane vapor for 1 hour wet the wafer in a satisfactory manner.
[b] Pass indicates that a wafer spun coated with about a 1 micron film of photoresist showed variation in surface thickness of no greater than 100Å.
[c] Not measured.
[d] Photosensitizer A is a mixture of esters derived from the reaction of 2,3,4-dihydroxy-benzophenone with 1,2-naphthoquinone-2-diazo-5-sulfonylchloride. Photosensitizer B is compound (15).

It will be apparent that various modifications may be made by one skilled in the art within the scope of, and without departing from the spirit of, the present invention.

What is claimed is:

1. A positive photoresist formulation capable of providing no observable striation and excellent wetting properties comprising an admixture in solution of:
   (a) a diazo ketone photosensitive compound
   (b) an alkali soluble resin
   (c) a cyclic ketone solvent selected from the group consisting of cyclopentanone and blends of cyclopentanone and cyclohexanone
   (d) an aliphatic alcohol solvent having from 6 to 12 carbon atoms and wherein the cyclic ketone comprises at least 20 percent of the total solvent and the alcohol comprises at least 10 percent of the total solvent and wherein (c) and (d) are present in an amount sufficient to provide at least low striation and good wetting properties to said formulation when used as a positive photoresist.

2. The formulation of claim 1 wherein the cyclic ketone is cyclopentanone.

3. The formulation of claim 2 wherein the aliphatic alcohol solvent is selected from n-hexanol, n-octanol, 2-octanol, 1-heptanol, 2-methyl-1-pentanol and mixtures thereof.

4. The formulation of claim 1 wherein the photosensitive compound is 2,3,4-tris(6-diazo-5,6-dihydro-5-oxo-1-naphthalenesulfonyloxy)benzophenone.

5. The formulation of claim 1 wherein the photosensitive compound is 2-hydroxy-3,4-bis(6-diazo-5,6-dihydro-5-oxo-1-naphthalenesulfonyloxy)benzophenone.

6. The formulation of claim 1 wherein the photosensitive compound is 2,4-bis(6-diazo-5,6-dihydro-5-oxo-1-naphthalenesulfonyloxy)benzophenone.

7. The formulation of claim 1 wherein the photosensitive compound is 2,3-dihydroxy-4-(6-diazo-5,6-dihydro-5-oxo-1-naphthalenesulfonyloxy)benzophenone.

8. The formulation of claim 1 wherein the photosensitive compound is 2-hydroxy-4-(6-diazo-5,6-dihydro-5-oxo-1-naphthalenesulfonyloxy)benzophenone.

9. The formulation of claim 1 wherein the photosensitive compound is 2,3-dibromo-1-(6-diazo-5,6-dihydro-5-oxo-1-naphthalenesulfonyloxy)propane.

10. The formulation of claim 1 wherein the photosensitive compound is 2,4-bis(6-diazo-5,6-dihydro-5-oxo-1-naphthalenesulfonyloxy)benzophenone.

11. The formulation of claim 1 wherein the photosensitive compound is a mixture of 2-hydroxy-4-(6-diazo-5,6-dihydro-5-oxo-1-naphthalenesulfonyloxy)benzophenone and 2,4-bis(6-diazo-5,6-dihydro-5-oxo-1-naphthalenesulfonyloxy)benzophenone.

12. The formulation of claim 1 wherein the photosensitive compound is a mixture of 2,3,4-tris(6-diazo-5,6-dihydro-5-oxo-1-naphthalenesulfonyloxy)benzophenone; 2-hydroxy-3,4-bis(6-diazo-5,6-dihydro-5-oxo-1-naphthalenesulfonyloxy)benzophenone and 2,3-dihydroxy-4-(6-diazo-5-6-dihydro-5-oxo-1-naphthalenesulfonyloxy)benzophenone.

13. The formulation of claim 1 wherein the aliphatic alcohol is 2-octanol.

14. The formulation of claim 1 wherein the aliphatic alcohol is 1-heptanol.

15. The formulation of claim 1 wherein the aliphatic alcohol is 2-methyl-1-pentanol.

16. The formulation of claim 1 wherein the aliphatic alcohol is n-hexanol.

17. The formulation of claim 1 wherein the aliphatic alcohol is n-octanol.

18. The formulation of claim 2 wherein the aliphatic alcohol is n-hexanol.

* * * * *